United States Patent
Fuhr

(10) Patent No.: US 9,423,300 B2
(45) Date of Patent: Aug. 23, 2016

(54) FREQUENCY VISUALIZATION APPARATUS AND METHOD

(71) Applicant: Peter Fuhr, Knoxville, TN (US)

(72) Inventor: Peter Fuhr, Knoxville, TN (US)

(73) Assignee: Directed Sensing, Inc.

( * ) Notice: Subject to any disclaimer, the term of this patent is extended or adjusted under 35 U.S.C. 154(b) by 461 days.

(21) Appl. No.: 13/925,568

(22) Filed: Jun. 24, 2013

(65) Prior Publication Data

US 2014/0374569 A1    Dec. 25, 2014

(51) Int. Cl.
*G01R 29/08* (2006.01)
*G01J 3/02* (2006.01)
*G01R 23/17* (2006.01)

(52) U.S. Cl.
CPC ......... *G01J 3/0264* (2013.01); *G01R 29/0878* (2013.01); *G01R 29/0892* (2013.01); *G01R 23/17* (2013.01)

(58) Field of Classification Search
CPC .... G01J 1/02; G01J 29/0892; G01J 29/0878; H04N 7/18

USPC ............. 250/208.1, 204, 205, 206, 330–334, 250/494.1, 495.1, 552, 553; 342/52–66, 342/73–75, 89, 158, 176; 343/700 R, 721, 343/751, 754, 757, 758
See application file for complete search history.

(56) References Cited

U.S. PATENT DOCUMENTS

2012/0188623 A1\* 7/2012 Inoue ................... G02B 26/101
359/197.1

\* cited by examiner

*Primary Examiner* — Georgia Y Epps
*Assistant Examiner* — Don Williams
(74) *Attorney, Agent, or Firm* — Robinson IP Law, PLLC

(57) ABSTRACT

A system and apparatus for: (i) receiving an image of a visually perceptible scene; (ii) sensing the presence and intensity of signals in a selected frequency band, which may include one or more of radio frequency, microwave, infrared, visible and ultraviolet, in part or all of the scene; (iii) displaying the frequency band as a visually distinguishable overlay on the visually perceptible scene; and (iv) indicating whether the signal intensity for a selected frequency interval is changing with passage of time.

12 Claims, 11 Drawing Sheets

FREQUENCY VISUALIZATION APPARATUS AND METHOD

FIELD

This disclosure relates to sensing, representation, visualization and display of characteristics of signals detected in selected frequency bands.

BACKGROUND

A vast amount of information and/or energy is traveling all around us at any given time whether in the form of radio waves, visible light, invisible light, audible acoustic waves, inaudible acoustic waves, microwaves, and other similar waves, but the vast majority of this information and/or energy is unseen and/or unheard to the average human. The effect of average humans not being able to visually detect such waves is often trivial, but in certain environments (e.g., combat, industry, space), such unseen information and/or energy can be hazardous and, in some cases, deadly.

What is needed, therefore, is a means by which to better detect waves that are typically undetectable to the average human, preferably bringing much more of the light and sound spectrums within reach of the human senses.

SUMMARY

It would be useful in some environments to provide a visual representation of frequencies present in a selected portion of the radiofrequency, microwave, infrared, visible or ultraviolet spectrum, in order to estimate locations and intensities of sources that may be producing such frequencies—particularly those that are not readily apparent to the basic five human senses. It would also be useful to provide an indication of an intensity or strength of these frequencies, or an indication of whether the associated intensity or strength of particular frequencies is above a threshold that is of concern, and to provide an alert signal when the intensity or shape characteristics of this frequency overlay is changing by at least a threshold amount.

A frequency visualization apparatus for detecting and displaying one or more specific sets of energy waves based on one or more of defined discrete sets of frequency ranges is disclsoed, the apparatus comprising: a power source; a microprocessor connected to the power source, the microprocessor further comprising data storage for storing pre-defined energy threshold values for one or more specified frequency ranges; a first receiver connected to the microprocessor, the first receiver for receiving a first set of energy waves wherein the first receiver comprises a detector array comprising a plurality of detector elements; a light emitting matrix connected to the microprocessor, the light emitting matrix comprising a plurality of discrete light emitting picture elements, each picture element paired to a specific detector element wherein each individual picture element will only become energized if the particular detector element paired with that particular picture element has received a set of energy waves that meets one of the predefined energy threshold values; a collimator in optical alignment with the light emitting matrix for receiving light produced from the light emitting picture elements, and collimating such light from the light emitting picture elements; a mirror in optical alignment with the collimator, the mirror for directing light transferred from the collimator to a light beam combination apparatus; an optical assembly for receiving light waves within the visual electromagnetic spectrum; and the light beam combination apparatus in optical alignment with the mirror and the optical assembly wherein the light beam combination apparatus is configured to combine the discrete picture elements from the mirror with the light received from the optical assembly, thereby forming a combined image for viewing by a user.

The frequency visualization apparatus may further comprise an optical condenser in optical alignment with the light beam combination apparatus, the optical condenser for altering the combined image for better viewing by a user.

The one or more specified frequency ranges may further comprise corresponding wavelength ranges selected from the group consisting of from about 0.1 nm to about 10 nm; from about 10 nm to about 400 nm; from about 400 nm to about 700 nm; from about 1 μm to about 1000 μm; from about 1 mm to about 10 cm; and from about 50 cm to about 10 m.

In a related embodiment, a frequency visualization apparatus for detecting and displaying one or more specific sets of energy waves based on one or more of defined discrete sets of frequency ranges is disclosed, the apparatus comprising: a power source; a microprocessor connected to the power source, the microprocessor further comprising data storage for storing pre-defined energy threshold values for one or more specified frequency ranges; a first receiver connected to the microprocessor, the first receiver for receiving a first set of energy waves wherein the first receiver comprises a frequency detector array comprising a plurality of frequency detector elements wherein the microprocessor assigns each applicable individual frequency detector element an active status if the particular frequency detector element receives a set of energy waves that meets one of the predefined energy threshold values and wherein the microprocessor assigns each applicable individual frequency detector element a non-active status if the particular frequency detector element does not receive a set of energy waves that meets one of the predefined energy threshold values; a second receiver connected to the microprocessor, the second receiver comprising an optical assembly for receiving light waves, the optical assembly comprising an optical detector array subdivided into discrete picture elements; a display apparatus connected to the microprocessor, the display apparatus for displaying a combined image comprising the frequency detector elements assigned an active status superimposed with the discrete picture elements. The one or more specified frequency ranges may further comprise corresponding wavelength ranges selected from the group consisting of from about 0.1 nm to about 10 nm; from about 10 nm to about 400 nm; from about 400 nm to about 700 nm; from about 1 μm to about 1000 μm; from about 1 mm to about 10 cm; and from about 50 cm to about 10 m.

In many embodiments, the light intensity of each individual picture element varies depending on the intensity of the sets of energy waves received by each respective frequency detector element paired with an individual picture element, such varying intensity based on a graduated scale of pre-defined threshold energy values wherein received energy intensity is proportional to light intensity for each picture element.

In many embodiments, the light color of each individual picture element varies depending on the intensity of the sets of energy waves received by each respective frequency detector element paired with an individual picture element, such varying intensity based on a graduated scale of pre-defined threshold energy values wherein received energy intensity values are grouped as sub-ranges wherein each sub-range is assigned a specific color.

In many embodiments the shape of each individual picture element varies depending on the intensity of the sets of energy waves received by each respective frequency detector element paired with an individual picture element, such varying intensity based on a graduated scale of pre-defined threshold energy values wherein received energy intensity values are grouped as sub-ranges wherein each sub-range is assigned a specific shape.

A method of overlaying one or more specific sets of energy waves based on one or more of defined discrete sets of frequency ranges onto a captured visual image is disclosed, the method comprising the steps of: providing a power source; storing a criteria schedule on a microprocessor connected to the power source, the criteria schedule including qualitative and/or quantitative data for various energy waves and correlating such qualitative and/or quantitative data to a specific apparatus function; receiving a first set of energy waves using a first receiver wherein the first receiver comprises a detector array comprising a plurality of detector elements; providing a light emitting matrix connected to the microprocessor, the light emitting matrix comprising a plurality of discrete light emitting picture elements, each picture element paired to a specific detector element; energizing a particular picture element based on the criteria schedule in response to the one or more sets of energy waves detected by the detector element specifically paired thereto; positioning a collimator to be in optical alignment with energized light from the energized picture elements; collimating light received from the one or more energized picture elements; positioning a mirror to be in optical alignment the collimated light from the energized picture elements; redirecting light transferred from the collimator to a light beam combination apparatus using the mirror; receiving light waves within the visual electromagnetic spectrum through an optical assembly; and directing the received light waves received through the optical assembly to a light beam combination apparatus in optical alignment with the mirror and the optical assembly; and combining the energized picture elements from the mirror with the light received from the optical assembly using the light beam combination apparatus, thereby forming a combined image for viewing by a user.

In another embodiment, a method of overlaying one or more specific sets of energy waves based on one or more of defined discrete sets of frequency ranges onto a captured visual image is disclosed, the method comprising the steps of: providing a power source; storing a criteria schedule on a microprocessor connected to the power source, the criteria schedule including qualitative and/or quantitative data for various energy waves and correlating such qualitative and/or quantitative data to a specific apparatus function; receiving a first set of energy waves using a first receiver as a first data set, wherein the first receiver comprises a frequency detector array comprising a plurality of frequency detector elements, wherein the frequency detector array is in communication with the microprocessor; storing the received first set of energy waves as a first data set; receiving a second set of energy waves using an optical assembly including an optical detector array, wherein the optical detector array comprises a plurality of optical detector elements and wherein the optical detector array is in communication with the microprocessor; storing the received second set of energy waves as a second data set; assigning each applicable individual frequency detector element an active status if the particular frequency detector element receives a set of energy waves that meets a predefined threshold value in the criteria schedule and assigning each applicable individual frequency detector element a non-active status if the particular frequency detector element does not receive a set of energy waves that meets a predefined threshold value in the criteria schedule; modifying the first data set based on assignment of active or non-active status of each particular frequency detector element, wherein frequency detector elements assigned a non-active status are further assigned a do not display command, thereby generating a modified first data set wherein only the frequency detector elements assigned an active status are to be displayed; sending the modified first data set and the second data set to a display apparatus to be visually displayed;

pairing data from the modified first data set associated with each discrete frequency detector element with data from the second data set associated with corresponding discrete optical detector elements, wherein the paired detector elements substantially overlap when visually displayed; and displaying an image corresponding to the modified first data set superimposed over the second data set. The qualitative and/or quantitative data included in the criteria schedule may comprise predefined frequency intervals. An additional step includes selecting a predefined frequency interval within which the first set of energy waves are temporarily defined.

BRIEF DESCRIPTION OF THE DRAWINGS

Further features, aspects, and advantages of the present disclosure will become better understood by reference to the following detailed description, appended claims, and accompanying figures, wherein elements are not to scale so as to more clearly show the details, wherein like reference numbers indicate like elements throughout the several views, and wherein:

DETAILED DESCRIPTION

Figure 1:
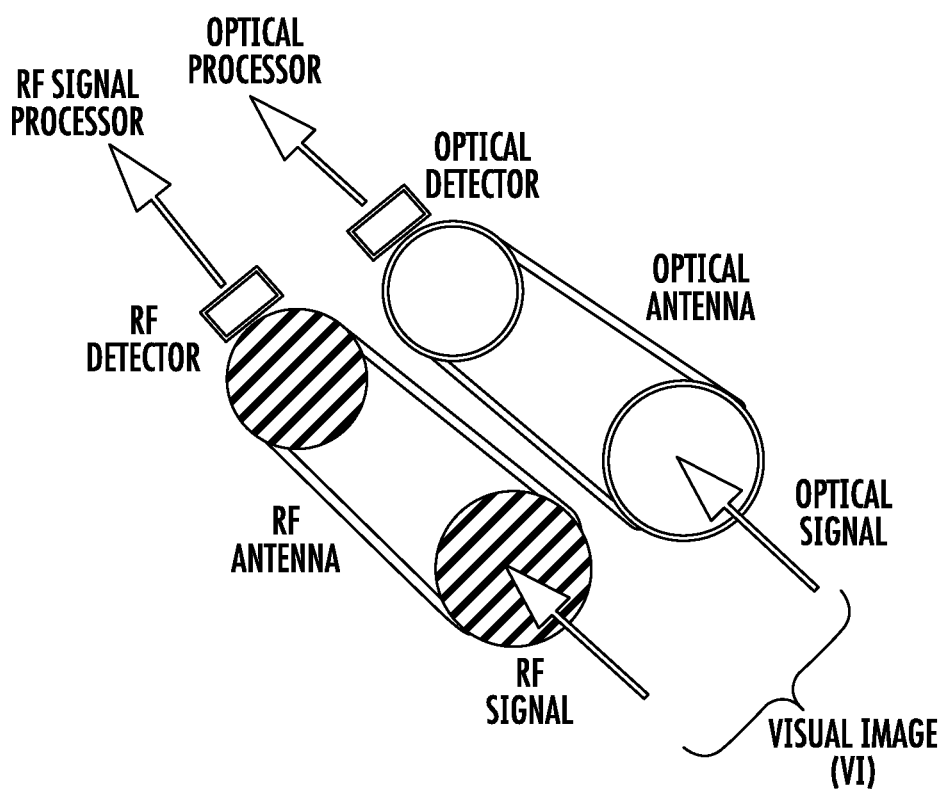
FIG. 1 is a schematic illustration of a frequency visualization system according to one embodiment of the disclosure.

Various terms used herein are intended to have particular meanings. Some of these terms are defined below for the purpose of clarity. The definitions given below are meant to cover all forms of the words being defined (e.g., singular, plural, present tense, past tense). If the definition of any term below diverges from the commonly understood and/or dictionary definition of such term, the definitions below control.

The phrase "connected to" can be interpreted as "in communication with", but the use of this phrase "connected to" does not necessitate the same meaning as the phrase "in communication with".

The phrase "in communication with" means that two items are in communication with one another either directly (e.g., by wire") or indirectly (e.g., by wireless communication).

A system for recognizing the presence of frequencies in a selected portion of the electromagnetic spectrum and for presenting electronic and/or visual signals that represent these frequencies is disclosed. A visual image is split into at least a first frequency dependent image component and a second frequency dependent image component, with the first component including only frequencies in a selected frequency-limited detection interval (FDI), for example, a portion of the radio frequency, microwave, mid-infrared, near-infrared, visible and/or ultraviolet spectrum; and the second component including an image as perceived by a human eye or similar image formation system.

In one embodiment, the first image component is formed by passing the image through a first array of M1 FDI detectors to produce an array of "flixels", then through a second array of, for example, M2 LEDs, with each LED being coupled to, at most, one of the FDI detectors in the first array. As referred to herein, a "flixel" corresponds to a small segment of an image (analogous to a pixel), but the information associated with the flixel is limited to a selected frequency-limited detection interval (FDI). By contrast, a pixel on a computer monitor or television screen may include information associated with visible, near-infrared and near-ultraviolet wavelengths and is not necessarily limited to a specified wavelength or frequency interval. The system, or the user, may vary the choice of FDI over a discrete set of FDIs, partly overlapping or wholly distinct from each other (e.g., microwaves, radio waves, ultraviolet waves).

The second (LED) array for the first image component produces a set of visual image components, each representing a small portion of the original image. Each small portion of the image, as represented by the second array, is transparent (or, alternatively, opaque) unless that small portion of the image has at least one FDI frequency with an associated signal intensity or strength that is at least a selected threshold intensity value. If a frequency in the FDI (referred to for convenience herein as an "FDI frequency") for a pixel in the first image component has an associated signal intensity or signal strength at least equal to a selected threshold intensity value, that image pixel will have a non-transparent (or non-opaque) image component representing the above-threshold FDI frequency present.

An output signal from the second array of LEDs for the first image component will thus be transparent (or opaque), except for individual LED flixels where at least one FDI frequency is present with an associated signal intensity or strength at least equal to the threshold intensity value. This output signal from the array of LEDs is re-aligned and combined, flixel-by-flixel, with corresponding pixels of the second image component and is presented as a combined image in a visually perceptible format, or an electronic format corresponding to this combined image.

In another embodiment, the second image component is divided into pixels of the original image, corresponding to flixels in the array of FDI detectors, and is processed as a standard visual image. The original image is again divided into a first image component and a second image component, and the first image component is divided into pixels of the original image corresponding to the flixels of the first image component, and each pixel signal is passed through an optical detector array (e.g., visible or near-infrared or near-ultraviolet) to produce a standard visual image, with flixel-by-corresponding-flixel alignment of the first and second image components. The first image component flixels and the aligned second image component pixels are combined in a microprocessor, and the combined images are displayed directly on a display screen in a visual format.

In yet another embodiment, a directional antenna having a narrow angular sector (e.g., 10°-30° and an adjustable (narrow) view video camera are mounted on first and second turntables that are rotationally coordinated so that the antenna "view" and the video camera view substantially the same narrowly defined portion of a selected scene, producing first and second image components, respectively. An antenna output signal is received by a frequency-limited detector (e.g., a flixel or group of related flixels) with a narrowly defined FDI (e.g., having a frequency resolution of $\Delta f \approx 330$ KHz). Spectral analysis is performed by a computer on an output signal from the frequency detector for each of a sequence of frequency resolution windows that cover the total frequency interval width of interest, such as, for example, 1 MHz or 5 MHz or 20 MHz width. Optionally, the computer includes a visual display for an associated signal intensity for each FDI. Spectrum-analyzed computer output signals are carried on a data transmission medium (e.g., an S-video channel) and received and processed by a composite converter module to produce a first component of a composite video signal. The video camera produces a second component of the composite video signal, and the first and second components are received and processed by a video signal mixer to produce a visually perceptible composite video signal, including a visually perceptible image component (video camera) of the scene and a frequency-limited overlay component as an image overlay.

In each embodiment, the visual intensity of the frequency-limited overlay component can be weighted according to the relative intensities of the FDI components, or according to any other suitable weighting allocation. The frequency-limited overlay components can be presented as time-sequenced image overlays, or can be presented in one or more groupings of FDIs.

FIG. 1 illustrates the general context of the disclosure where visible and FDI views of the same scene (field of view) are captured, processed and visually overlaid by each processing arm.

Figure 2:
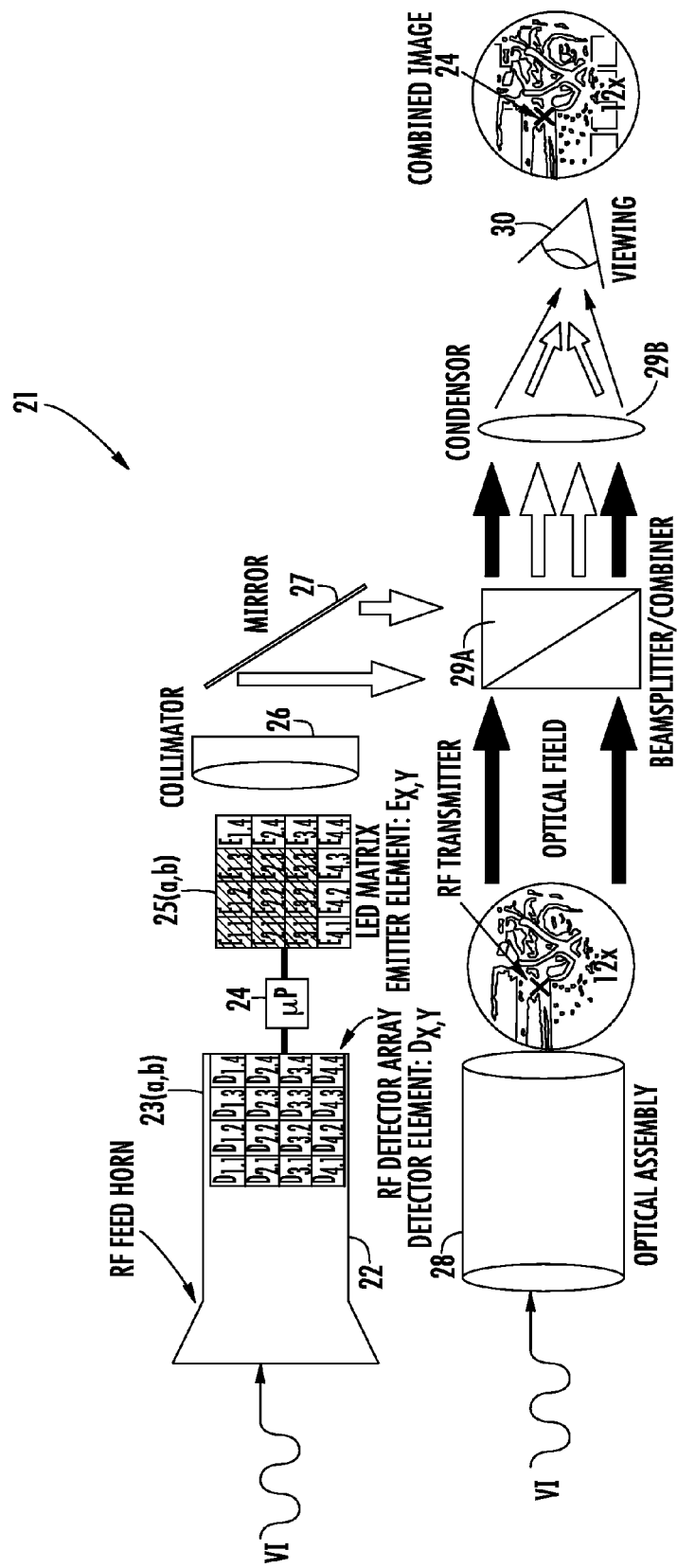
FIGS. 2-4 are schematic illustrations of a frequency visualization system according to one embodiment of the disclosure.

FIG. 2 schematically illustrates an embodiment of the disclosure. A visual image (VI) signal is received by an FDI feed horn 22 (e.g., an RF feed horn), and the signal(s) is fed to a first array 23 of M1 frequency detectors 23($a,b$). In one approach, each frequency detector 23($a,b$), with a corresponding location indexed as L(m1), has the same frequency-limited detection interval FDI (e.g., 2.395≤f (GHz) ≤2.405) for each detector. The FDI can be varied from one frequency interval to another to cover a desired frequency range.

Presence (or absence) of one or more frequencies in the selected FDI is sensed at each of the M1 regions in the visual image signal received by the FDI feed horn 22. The signal produced at each location L(m1) (m1=1, . . . , M1) by a corresponding frequency detector is processed by a programmed microprocessor 24, and the processed signals produce a second array 25 of output signals at M2 LEDs 25($a,b$), numbered m2=1, . . . M2 (M2≈M1), with the signal produced at frequency detector number m1 corresponding to and being received at LED number m2=m1 to produce an LED output signal number m2=m1. The sequence of LED output signals is collimated and aligned by a collimator 26 and reflected by a mirror 27 to produce an array of FDI signals, with the same FDI.

The VI signal is also received by a video camera or other image formation mechanism 28 that produces a visually perceptible field of pixel values, with each pixel corresponding to a flixel in the FDI array, and the pixel signal(s) is combined with the FDI signal from the mirror 27 in a beamsplitter and combiner 29A. The combined beams (FDI plus original visual image) are optically processed by a condenser 29B and are presented at a viewing mechanism 30, which may be a display screen or other suitable electronic instrument.

Figure 3:
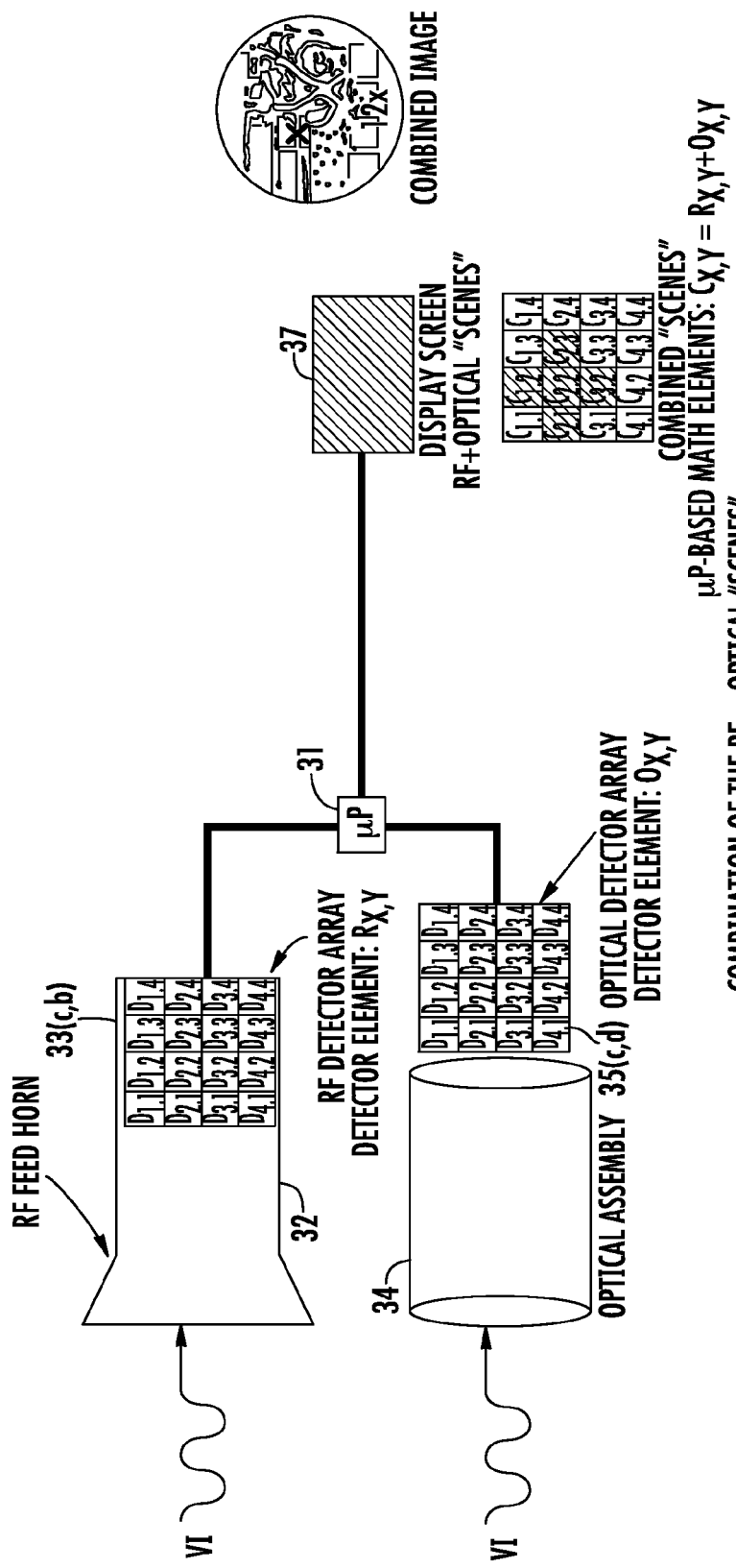

In another embodiment, shown in FIG. 3, the VI signal is again divided into a first image component and a second image component, and the first image component is passed through an FDI feed horn 32 to an array 33 of M1 frequency detectors 33($c,d$) to provide a sequence of flixels, with each flixel corresponding to a small selected area of the visual image VI. Optionally, in each embodiment, a flixel in the array 33 ($c,d$) registers information for the specified FDI only if the signal intensity (peak or integrated, as desired) is above (or at least equal to) a selected threshold intensity value; otherwise, the flixel is transparent (or, alternatively, opaque). The second image component is passed through an optical assembly to an array 35 of optical detectors 35($c,d$), covering a visible and/or an infrared frequency interval of interest, with each pixel 35($c,d$) in the optical detector array 35 corresponding to a flixel 33 ($c,d$) in the FDI detector array 33. The output signals from the FDI detector array 33 and the output signals from the optical detector array 35($c,d$) are combined, flixel-by-corresponding-pixel, in a microprocessor 31 and presented to a display screen or other visualization mechanism 37. Where the first image component is blocked, only a conventional visually perceptible optical image appears on the visualization mechanism 37. Where the second image component is blocked, information appears on the visualization mechanism 37 only for the flixels with the intensity values at or above threshold in the specified FDI. Where neither the first image component nor the second image component is blocked, a composite image (above-threshold FDI plus optical image) appears on the visualization mechanism 37.

Figure 4:
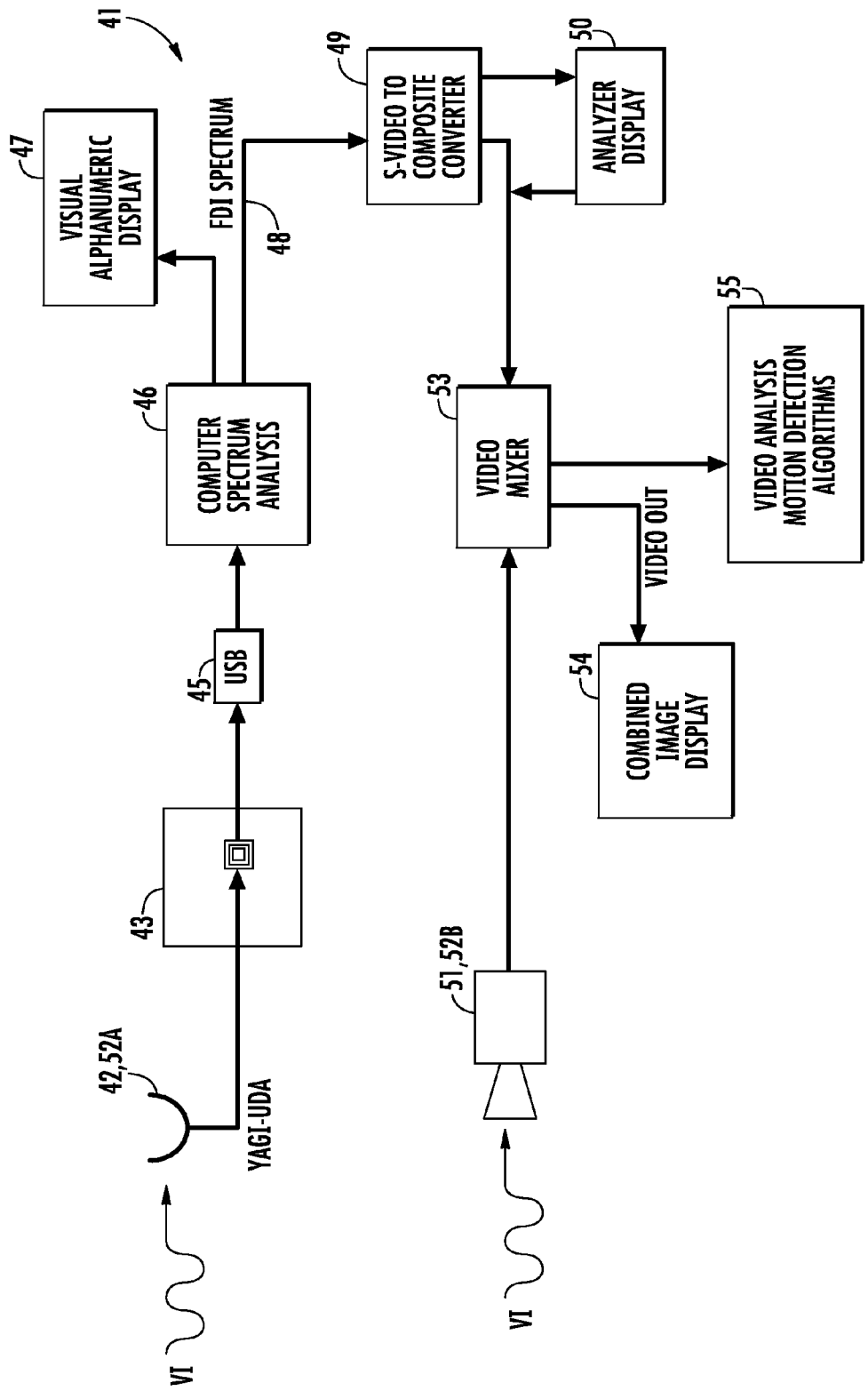
Figure 5:
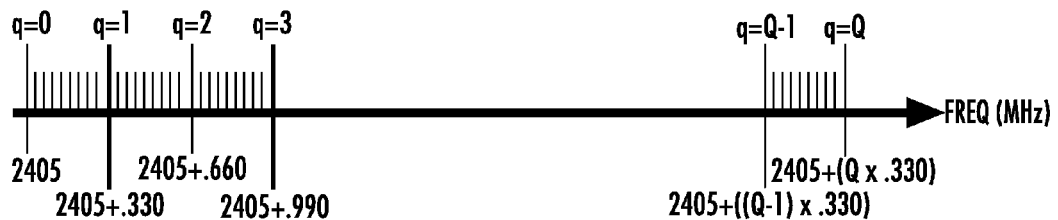
FIG. 5 is an illustration of a division of a portion of a frequency interval into distinct frequency segments according to one embodiment of the disclosure.

FIG. 4 schematically illustrates yet another embodiment 41, which is partly parallel to the embodiment, in FIG. 2. A VI signal is received by a directional antenna 42, such as a Yagi-Uda multi-element directional antenna operating in a selected portion (FDI) of the electromagnetic spectrum, for example, with a 10°-30° sector (adjustable or fixed) field of view and an 18 dB gain factor. An output signal from the directional antenna 42 is received by a frequency-limited detector 43 which has an FDI in a selected portion of the range 2.405≤f (GHz)≤2.485, for example, and a frequency resolution of Δf≈330 KHz. Spectral analysis is performed on the received signal within this 330 KHz window, yielding a synthesized set of FDI signals, each having a relatively small frequency width, such as Δf≈330 KHz, with a central frequency of $f_q$ (KHz)=2405+165+330q (q=1, . . . , Q). In this configuration, the FDI signal detector 43 covers a frequency range of 2405 KHz≤f≤2405+Q330 KHz, as illustrated in FIG. 5. Optionally, two, three or more of the FDI frequency intervals (consecutive or non-consecutive) can be combined for display as part of an image overlay.

The detector-processed signal in FIG. 4 is received by an input port 45 (e.g., a USB port) on a computer 46, having an optional display mechanism 47 (e.g., a split screen display) that is programmed to perform spectrum analysis on each of the input signals. The spectrum-analyzed output signals from the computer 46 are sent on a data transmission medium 48 (e.g., an S-video channel) and are converted by a composite converter 49 to produce composite video signals on an analyzer display 50, according to an IEEE standard (e.g., one of the standards IEEE 802.11, 802.15.1 or 802.15.4). Optionally, visual image information in at most one of the frequency segments at a time, 2405+165+330q≤$f_q$ (KHz)=2405+165+330(q+1) is received by the S-video-to-composite converter 49 and is provided as a frequency-limited component of a first composite video output signal.

Figure 8:
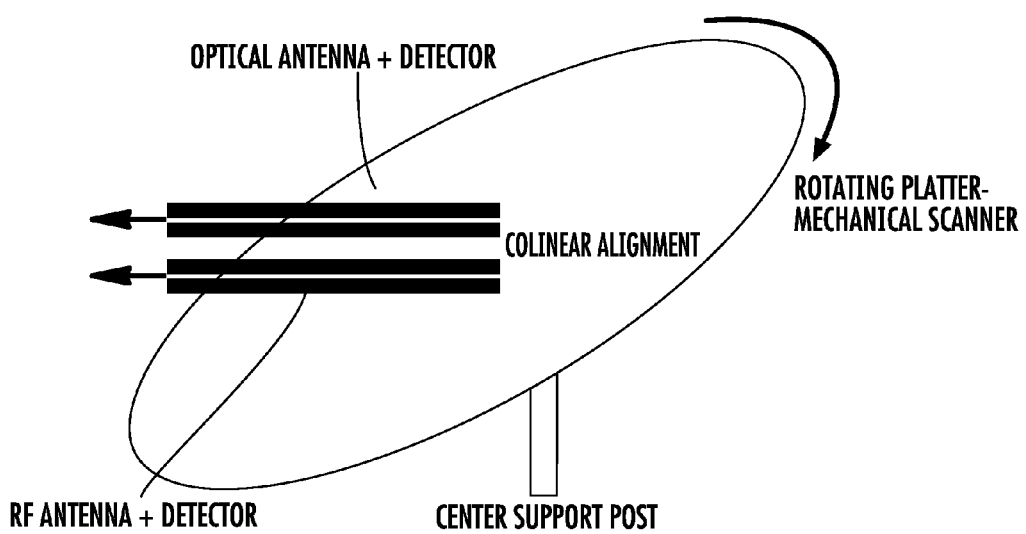
FIG. 8 illustrates an optical and RF antenna mounted to turntables to facilitate alignment of received images according to one embodiment of the disclosure.

The visual image signal VI, or a parallax-correlated replica of the VI signal is also received by a video camera 51 with an adjustable (narrow) field of view. Preferably, the directional antenna 42 and the video camera 51 are mounted on one or more turntables, 52A and 52B (illustrated in FIG. 8), that provide substantially aligned visual image views. The visual image view from the video camera 51 and the frequency-limited output signal from the composite converter 49 are received at first and second input terminals of a video mixer 53. A first composite video output signal from the video mixer 53 is received by and displayed at a visual display mechanism 54, such as a display screen.

Figure 6:
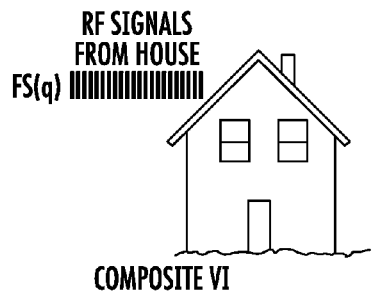
FIG. 6 is an illustration of an overlay of a visually perceptible image and a frequency-limited overlay according to one embodiment of the disclosure.

The display on the display mechanism 54 presents the visually perceptible VI signal, plus a visually distinguishable and partly transparent overlay, illustrated in FIG. 6, that indicates the presence of electromagnetic signals in a selected frequency segment, such as, for example, 2405+ 165+330q≤$f_q$ (KHz)=2405+165+330(q+1), in part or all of the VI signal received. The FDI frequency segment may appear in only part of or in all of the composite image. Presence of the frequency segment may be indicated by use of an unusual color, such as deep purple, or by use of a pattern having a discernable texture, such as stripes or cross-hatching, as an overlay in portions of the displayed VI signal where the frequency segment is present (with intensity values at or above threshold). The intensity of this overlay can be caused to increase monotonically with increasing a signal intensity of the frequency segment, and this intensity can be variable over different portions of the VI signal and the composite image. Optionally, different frequency segments $f_q$, corresponding to q=1, 2, . . . , Q, can be shown in a time shared manner as overlays in different timer intervals, preferably non-overlapping, with an associated indicium that identifies which frequency segment $f_q$ is currently being viewed as an overlay. In one cycle, with temporal length of 2-30 sec., all frequency segments can be shown as separate overlays on the VI signal at different times in the cycle.

Figure 7:
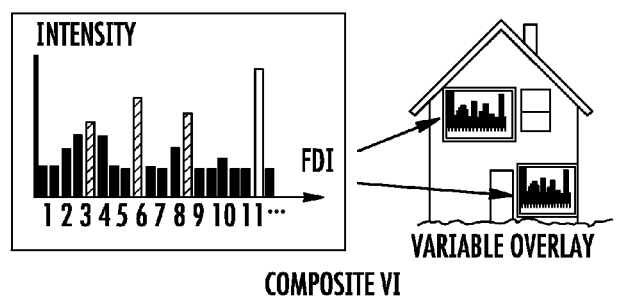
FIG. 7 is an illustration of a visually perceptible image with a graphical overall representing relative signal intensities in a sequence of FDIs according to one embodiment of the disclosure.

Alternatively, relative intensities of the different FDI frequency segments can be displayed graphically as a histogram on the visually perceptible image, as illustrated in FIG. 7, with two or more FDI contributions displayed as separate bars.

A second composite video output signal from the video mixer 53 is optionally received by a computer module 55 (e.g., Linux-based), which is programmed to detect motion of, or change in, one or more FDI segment overlays, by comparison of a frequency selector output signal intensity at two or more distinct times. The motion detector computer module 55 can be programmed to provide an audibly perceptible or visually perceptible alert or alarm signal whenever the change or difference in two or more of the fixed frequency segments, relative to each other, with passage of time is at least a selected threshold difference level.

As noted in the preceding disclosure, the visual intensity of each frequency-limited overlay component can be weighted according to the relative intensities of the FDI components, or according to any other suitable weighting allocation. For example, where relative intensity of one or more of the FDI components is changing, as sensed by a change detector module (e.g., 55 in FIG. 4), the relative intensity can be replaced by (i) time averaged mean of the relative intensity, (ii) standard deviation of the relative intensity, (iii) standard deviation, divided by mean, of the relative intensity, or (iv) mean plus a selected fraction (e.g., 0.5 or 1 or 2) of the standard deviation of the relative intensity. The frequency-limited overlay components can be presented as time-sequenced image overlays, or can be presented in one or more groupings (adjacent or non-adjacent) of FDIs to provide more extensive frequency coverage.

The displayed or visual intensity of each frequency-limited overlay component can also vary monotonically with the relative intensities of the FDI components so that, for example, a larger FDI relative intensity will produce a more intense visual display of the FDI component.

The frequency interval, $2405 \leq f(KHz) \leq 2405+Q330$, illustrated in FIG. 5 can be replaced by any other frequency interval that covers part of or all of the rf range, the microwave range, the infrared range, the visible range and/or part or all of the ultraviolet range, for purposes of application of various embodiments of the disclosure.

The frequency visualization system may be adapted to a portable form factor such that the frequency visualization system may be mounted to a vehicle or carried as a lightweight portable device, such as the device illustrated in FIGS. 9-15.

Figure 9:
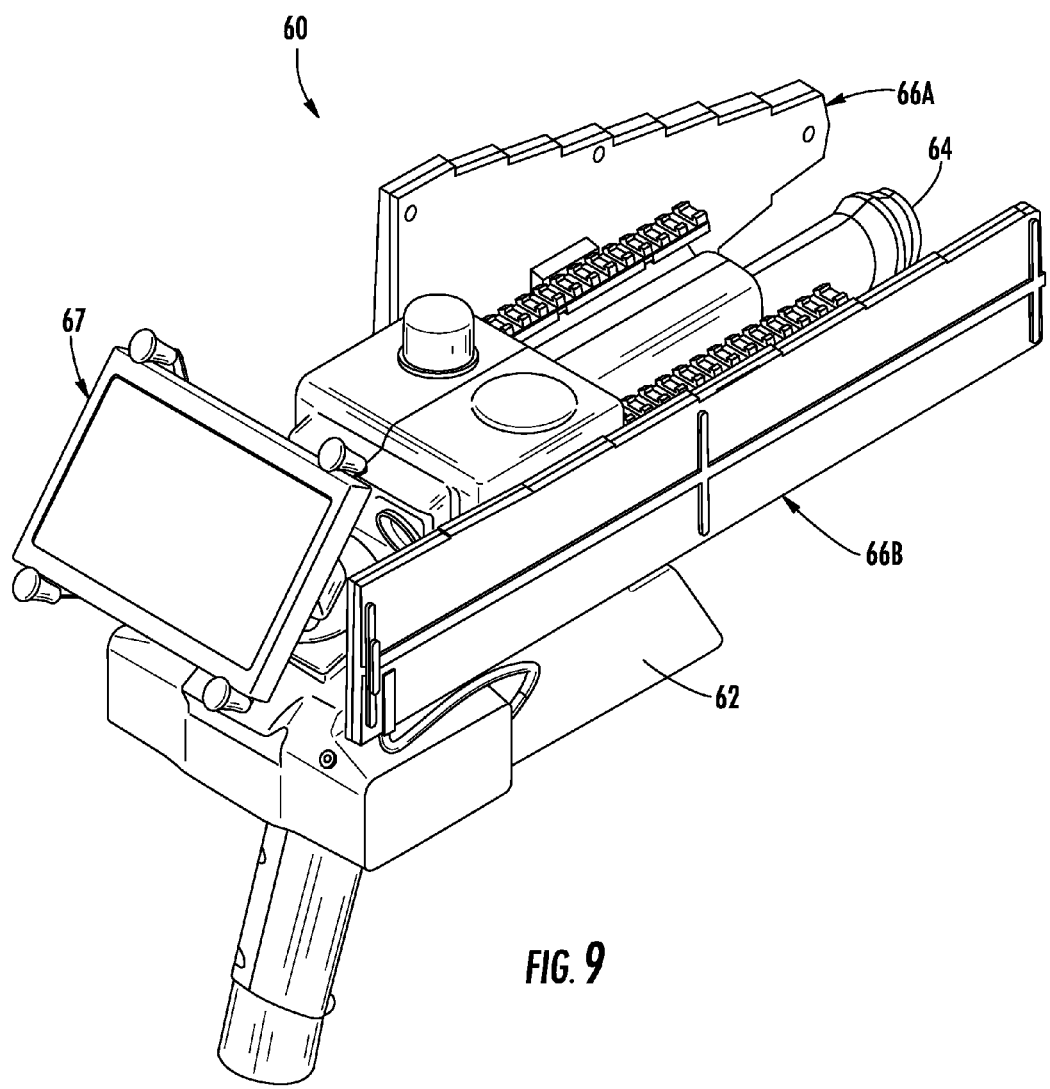
FIG. 9 shows a somewhat schematic perspective view of a portable handheld frequency visualization apparatus as described herein.

FIG. 9 shows a perspective view of one embodiment of a portable frequency visualizer 60. The portable frequency visualizer 60 includes a housing 62, a camera 64, one or more antennas 66A and 66B for detecting various frequencies as disclosed above and a display 67. The portable frequency visualizer 60 is compact allowing the visualizer 60 to be operated handheld by a single user. The portable frequency visualizer 60 can be battery powered and/or powered by a DC power source or an AC power source and passed through an AC/DC converter.

Figure 10:
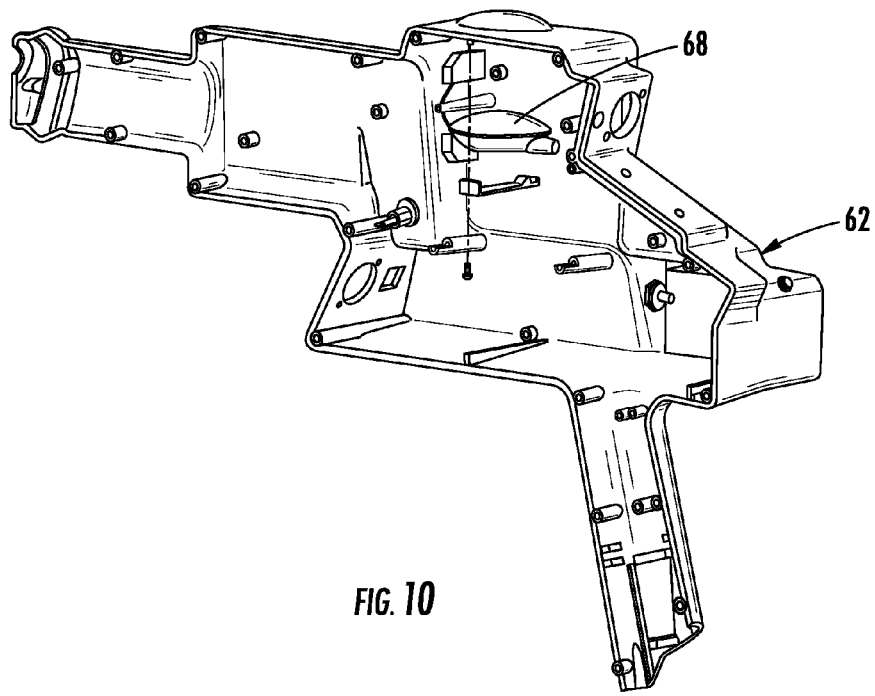
FIG. 10 shows a somewhat schematic internal side view of the portable handheld frequency visualization apparatus shown in FIG. 9.
Figure 11:
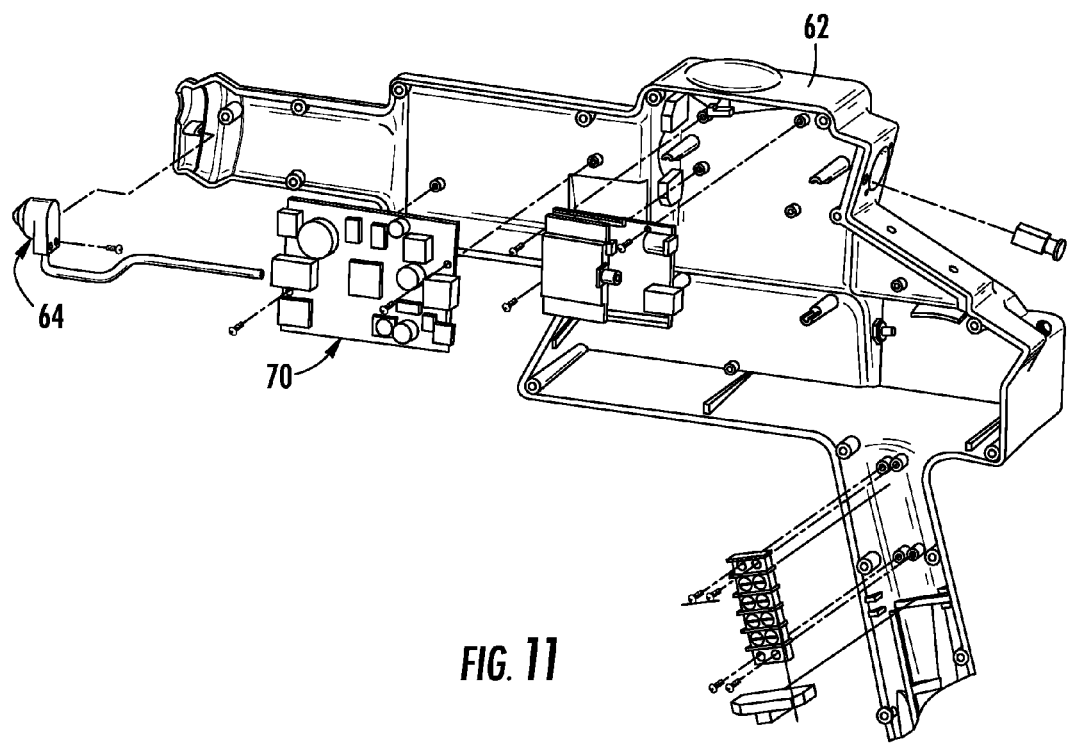
FIG. 11 shows a somewhat schematic exploded internal side view of the portable handheld frequency visualization apparatus shown in FIG. 9.

Referring to FIGS. 10 and 11, a cross-sectional side view of the portable frequency visualizer 60 is shown. The portable frequency visualizer 60 includes a GPS module 68 for locating a position of the visualizer and user. The camera 64 is secured in a forward portion of the portable visualizer 60 relative to the user, with the camera 64 in communication with a camera control board 70.

Figure 12:
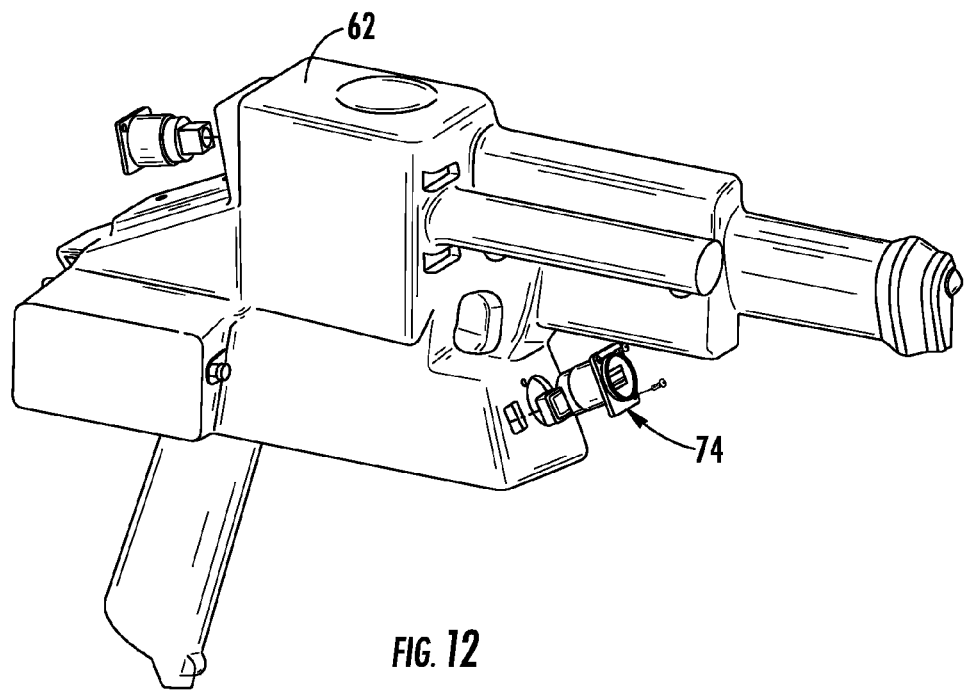
FIG. 12 shows a somewhat schematic external side view of the portable handheld frequency visualization apparatus shown in FIG. 9.
Figure 13:
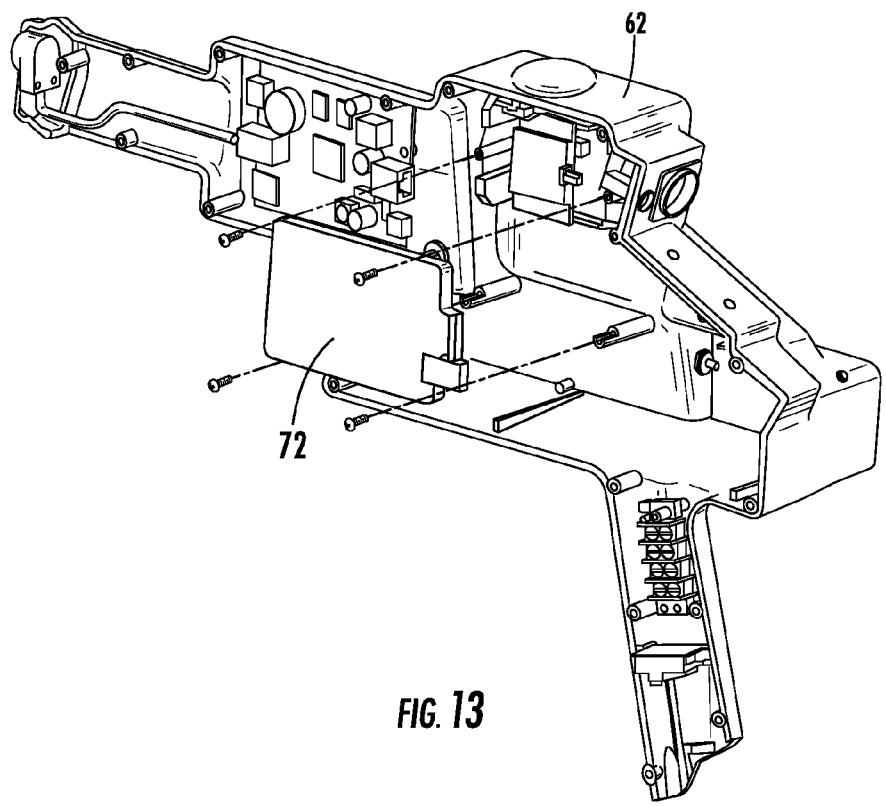
FIG. 13 shows a somewhat schematic exploded internal side view of the portable handheld frequency visualization apparatus shown in FIG. 9.

The portable frequency visualizer 60 further includes a storage component 72 such as a hard drive or solid state storage device and a connection terminal 74 such as, for example, a USB port for communicating with external devices such as a personal computer or other accessories as shown in FIGS. 12 and 13.

Figure 14:
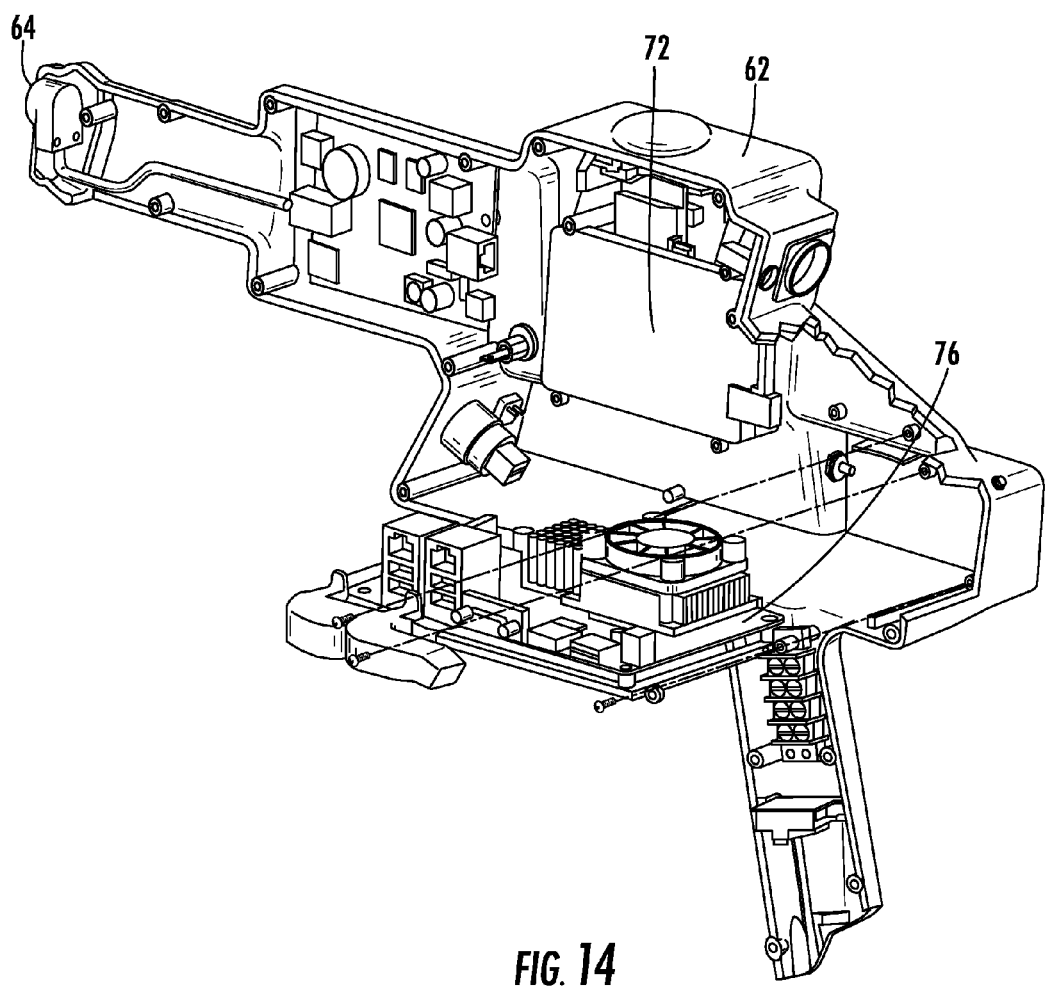
FIG. 14 shows a somewhat schematic exploded internal side view of the portable handheld frequency visualization apparatus shown in FIG. 9.
Figure 15:
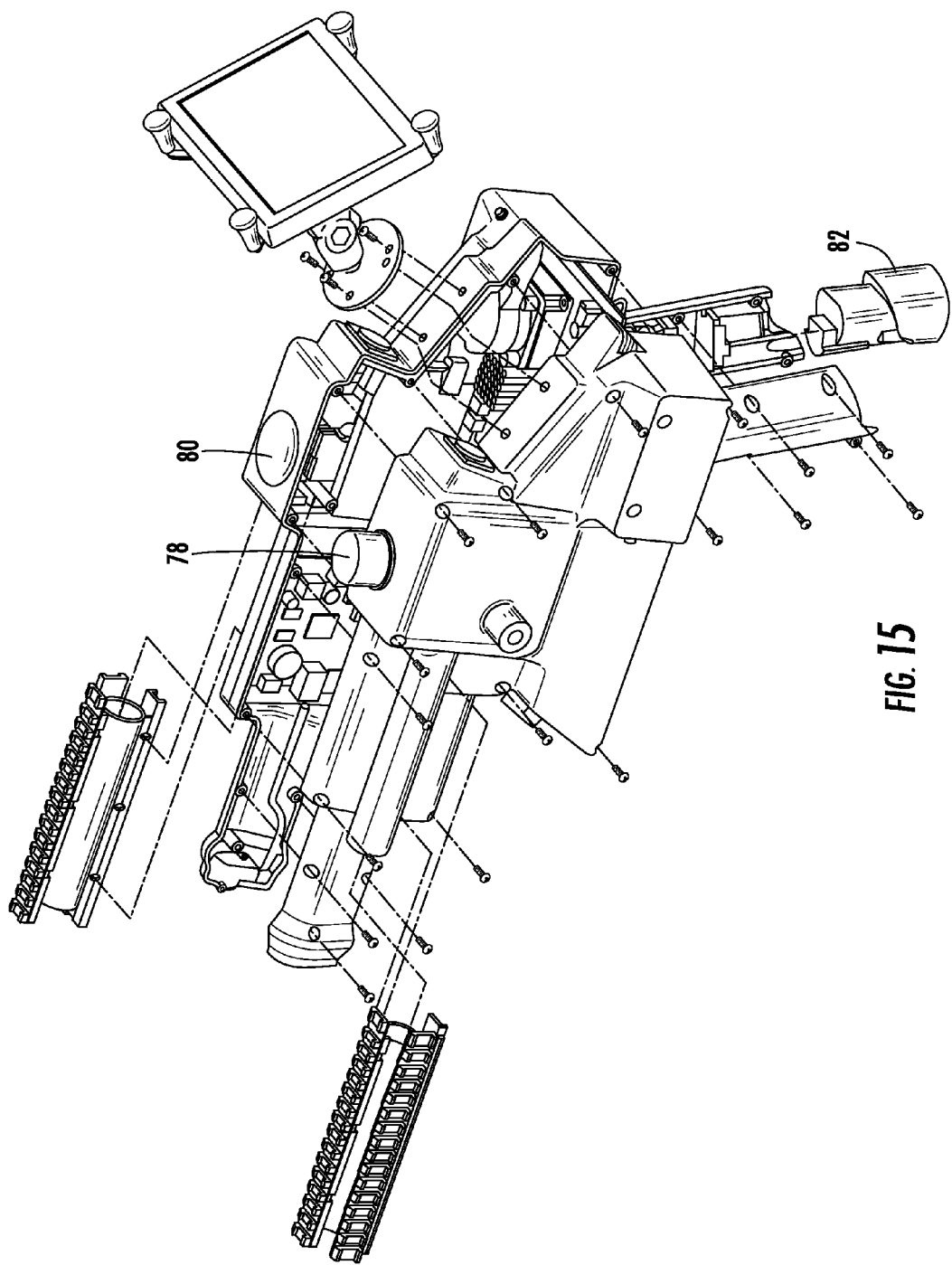
FIG. 15 shows a somewhat schematic exploded view of the portable handheld frequency visualization apparatus shown in FIG. 9.

Referring now to FIG. 14, the portable visualizer 60 includes a CPU module 76 in communication with the various components of the visualizer 60 for overlaying detected frequencies detected by the one or more antennas 66A and 66B from images received by the camera 64 and displaying the overlayed frequencies and image on the display 67. Additional components of the portable visualizer 60 include a wireless communications component 78, such as, for example, a WiFi antenna and/or a microwave antenna, a GPS unit 80 and a replaceable and rechargeable battery 82 as shown in FIG. 15, all of which are preferably connected either directly or wirelessly to the CPU module 76.

The foregoing description of preferred embodiments of the present disclosure has been presented for purposes of illustration and description. The described preferred embodiments are not intended to be exhaustive or to limit the scope of the disclosure to the precise form(s) disclosed. Obvious modifications or variations are possible in light of the above teachings. The embodiments are chosen and described in an effort to provide the best illustrations of the principles of the disclosure and its practical application, and to thereby enable one of ordinary skill in the art to utilize the concepts revealed in the disclosure in various embodiments and with various modifications as are suited to the particular use contemplated. All such modifications and variations are within the scope of the disclosure as determined by the appended claims when interpreted in accordance with the breadth to which they are fairly, legally, and equitably entitled.

What is claimed is:

1. A frequency visualization apparatus for detecting and displaying one or more specific sets of energy waves based on one or more defined discrete sets of frequency ranges, the apparatus comprising: a power source; a first receiver comprising an array of frequency detector elements for receiving a first set of energy waves and outputting a set of frequency output signals; a microprocessor connected to the power source and the first receiver, the microprocessor further comprising data storage for storing pre-defined energy threshold values for one or more specified frequency ranges and outputting corresponding LED input signals by assigning each applicable individual frequency detector element an active status if the particular frequency detector element receives a frequency output signal that meets one of the predefined energy threshold values and wherein the microprocessor assigns each applicable individual frequency detector elements a non-active status if the particular frequency detector element does not receive a frequency output signal that meets one of the predefined energy threshold values; a light emitting matrix connected to the microprocessor, the light emitting matrix comprising a plurality of discrete light emitting picture elements, each picture element paired to a specific frequency detector element in the array, wherein each individual picture element will only become energized based on one of the plurality of corresponding LED input signals if the particular frequency detector element paired with that particular picture element has received a set of energy waves that meets one of the predefined energy threshold values; a collimator in optical alignment with the light emitting matrix for receiving light produced from the light emitting picture elements, and collimating such light from the light emitting picture elements; a mirror in optical alignment with the collimator, the mirror for directing light transferred from the collimator, the mirror for directing light transferred from the collimator to a light beam combination apparatus; and a second receiver connected to the microprocessor, the second receiver comprising an optical assembly comprising an optical detector array subdivided into discrete picture elements for receiving light waves within the visual electromagnetic spectrum, the light beam combination apparatus in optical alignment with the mirror and the optical assembly wherein the light beam combination apparatus is configured to combine light from the discrete picture elements from the mirror with the light received from the optical assembly, thereby forming a combined superimposed image for viewing by a user.

2. The apparatus of claim 1 wherein the one or more specified frequency ranges further comprise corresponding wavelength ranges selected from the group consisting of from about 0.1 nm to about 10 nm; from about 10 nm to about 400 nm; from about 400 nm to about 700 nm; from about 1 μm to about 1000 μm; from about 1 mm to about 10 cm; and from about 50 cm to about 10 m.

3. The apparatus of claim 1 further comprising an optical condenser in optical alignment with the light beam combination apparatus, the optical condenser for altering the combined image for better viewing by a user.

4. The apparatus of claim 1 wherein the light intensity of each individual picture element varies depending on the intensity of the sets of energy waves received by each respective frequency detector element paired with an individual picture element, such varying intensity based on a graduated scale of pre-defined threshold energy values wherein received energy intensity is proportional to light intensity for each picture element.

5. The apparatus of claim 1 wherein the light intensity of each individual picture element varies depending on the intensity of the sets of energy waves received by each respective frequency detector element paired with an individual picture element, such varying intensity based on a graduated scale of pre-defined threshold energy values wherein received energy intensity is proportional to light intensity for each picture element.

6. The apparatus of claim 1 wherein the light color of each individual picture element varies depending on the intensity of the sets of energy waves received by each respective frequency detector element paired with an individual picture element, such varying intensity based on a graduated scale of pre-defined threshold energy values wherein received energy intensity values are grouped as sub-ranges wherein each sub-range is assigned a specific color.

7. The apparatus of claim 1 wherein the light color of each individual picture element varies depending on the intensity of the sets of energy waves received by each respective frequency detector element paired with an individual picture element, such varying intensity based on a graduated scale of pre-defined threshold energy values wherein received energy intensity values are grouped as sub-ranges wherein each sub-range is assigned a specific color.

8. The apparatus of claim 1 wherein the shape of each individual picture element varies depending on the intensity of the sets of energy waves received by each respective frequency detector element paired with an individual picture element, such varying intensity based on a graduated scale of pre-defined threshold energy values wherein received energy intensity values are grouped as sub-ranges wherein each sub-range is assigned a specific shape.

9. The apparatus of claim 1 wherein the shape of each individual picture element varies depending on the intensity of the sets of energy waves received by each respective frequency detector element paired with an individual picture element, such varying intensity based on a graduated scale of pre-defined threshold energy values wherein received energy intensity values are grouped as sub-ranges wherein each sub-range is assigned a specific shape.

10. A method of overlaying one or more specific sets of energy waves based on one or more of defined discrete sets of frequency ranges onto a captured visual image, the method comprising:
providing a power source;
storing a criteria schedule on a microprocessor connected to the power source, the criteria schedule including qualitative and/or quantitative data for various energy waves and correlating such qualitative and/or quantitative data to a specific apparatus function;
receiving a first set of energy waves using a first receiver as a first data set, wherein the first receiver comprises a frequency detector array comprising a plurality of frequency detector elements, wherein the frequency detector array is in communication with the microprocessor;
storing the received first set of energy waves as a first data set;
receiving a second set of energy waves using an optical assembly including an optical detector array, wherein the optical detector array comprises a plurality of optical detector elements and wherein the optical detector array is in communication with the microprocessor;
storing the received second set of energy waves as a second data set;
assigning each applicable individual frequency detector element an active status if the particular frequency detector element receives a set of energy waves that meets a predefined threshold value in the criteria schedule and assigning each applicable individual frequency detector element a non-active status if the particular frequency detector element does not receive a set of energy waves that meets a predefined threshold value in the criteria schedule;
modifying the first data set based on assignment of active or non-active status of each particular frequency detector element, wherein frequency detector elements assigned a non-active status are further assigned a do not display command, thereby generating a modified first data set wherein only the frequency detector elements assigned an active status are to be displayed;
sending the modified first data set and the second data set to a display apparatus to be visually displayed;
pairing data from the modified first data set associated with each discrete frequency detector element with data from the second data set associated with corresponding discrete optical detector elements, wherein the paired detector elements substantially overlap when visually displayed; and
displaying an image corresponding to the modified first data set superimposed over the second data set.

11. The method of claim 10 wherein the qualitative and/or quantitative data included in the criteria schedule comprises predefined frequency intervals.

12. The method of claim 10 further comprising the step of selecting a predefined frequency interval within which the first set of energy waves are temporarily defined.

* * * * *